United States Patent [19]

Vinn et al.

[11] Patent Number: 4,717,888
[45] Date of Patent: Jan. 5, 1988

[54] INTEGRATED CIRCUIT OFFSET VOLTAGE ADJUSTMENT

[75] Inventors: Charles L. Vinn, Milpitas; David C. Stegmeir, Sunnyvale, both of Calif.

[73] Assignee: Raytheon Company, Lexington, Mass.

[21] Appl. No.: 866,432

[22] Filed: May 22, 1986

[51] Int. Cl.[4] .............................................. H03F 3/45
[52] U.S. Cl. ..................................... 330/261; 330/296
[58] Field of Search ....................... 330/261, 296, 307

[56] References Cited

U.S. PATENT DOCUMENTS

| | | | |
|---|---|---|---|
| 3,870,967 | 3/1975 | Wisseman | 330/261 |
| 4,045,746 | 8/1977 | Wheatley, Jr. | 330/307 X |
| 4,131,844 | 12/1978 | Comer | 340/347 |
| 4,138,671 | 2/1979 | Comer et al. | 340/347 |
| 4,207,536 | 6/1980 | Lewis | 330/261 X |

FOREIGN PATENT DOCUMENTS

| | | | |
|---|---|---|---|
| 118757 | 9/1979 | Japan | 330/307 |
| 191912 | 10/1984 | Japan | 330/261 |

OTHER PUBLICATIONS

Eroi, "A Precision Trim Technique for Monolithic Analog Circuits," 1975 IEEE International Solid-State Circuits Conference, Feb. 14, 1975, pp. 192, 193.
"Op AMP Has low Offset Voltage," *Electronics*, Aug. 28, 1980, pp. 288–290.

*Primary Examiner*—James B. Mullins
*Attorney, Agent, or Firm*—Richard M. Sharkansky

[57] ABSTRACT

An integrated circuit disposed in a package having a plurality of electrical interconnection leads, a first interconnection lead being adapted to receive an input signal during a normal operating mode of the integrated circuit. The integrated circuit comprises a supply voltage bus coupled to a second interconnection lead and fed by a reference potential and a differential amplifier comprising a pair of emitter-coupled transistors. The differential amplifier has a nominal offset voltage which is a function of a nominal resistance coupled between the collector electrode of a first one of the pair of emitter-coupled transistors and the reference potential. The nominal resistance is provided by a plurality of serially-coupled resistors. A network is coupled between the supply voltage bus and the collector electrode of the first transistor, such network comprising: a first resistor nominally electrically decoupled from between the supply voltage bus and said collector electrode; a switch element, responsive to a programming signal applied across the first and second interconnection leads during a programming mode of the integrated circuit, for electrically coupling the first resistor between the supply voltage bus and said collector electrode to change the offset voltage from the nominal offset voltage by a predetermined amount; and a control element operable during the programming mode to electrically couple the switch element to the first interconnection lead, and operable during the normal operating mode to electrically decouple the switch element from the first interconnection lead.

29 Claims, 2 Drawing Figures

INTEGRATED CIRCUIT OFFSET VOLTAGE ADJUSTMENT

BACKGROUND OF THE INVENTION

This invention relates generally to integrated circuits and more particularly to circuitry for adjusting or trimming the offset voltage of a differential amplifier of an integrated circuit.

As is known, an integrated circuit (IC) such as an operational amplifier (op amp), comparator or analog-to digital (A/D) or digital-to-analog (D/A) converter commonly includes a differential amplifier as the amplifying stage thereof. The differential amplifier typically comprises a pair of emitter-coupled, bipolar transistors having the base electrodes thereof fed by a pair of input signals. The coupled emitters are coupled to a constant current source. The collector electrodes of the pair of transistors are each coupled to a supply voltage through a predetermined resistance, with the differential output of the transistor pair being taken between such collector electrodes. Due to fabrication-induced mismatches between such pair of transistors, the differential amplifier requires a finite offset voltage to set the differential output voltage of the transistor pair to zero volts. As is known, such offset voltage is a function of the value of the collector resistances of the differential transistor pair; that is, adjusting the value of such resistances will vary the offset voltage.

Conventionally, offset voltage adjustment is performed while the integrated circuit is at the wafer level, that is, before an individual integrated circuit chip (commonly termed a "die") has been scribed and separated from an integrated circuit wafer (typically comprising an array of dice) and packaged in an integrated circuit package. Typically, the total collector resistance of each one of the differential pair of transistors of the integrated circuit is implemented as a plurality of discrete resistors serially coupled between the supply voltage and collector electrode, and a selected one, or ones, of such discrete resistors is shunted with a corresponding one, or ones, of zener diodes. That is, individual zener diodes are connected in parallel across selected individual collector resistors. Pads are provided on each individual integrated circuit chip or die at the anode and cathode electrodes of each zener diode. A large reverse-bias voltage is applied individually across a selected one, or ones, of the zener diodes, thereby inducing a sufficiently large reverse current therethrough to permanently short-circuit such selected one, or ones, of the zener diodes. The discrete resistors shunted by the short-circuited zener diodes thus are electrically bypassed, thereby incrementally reducing the collector resistance of the one of the pair of transistors coupled thereto and trimming the offset voltage of the differential pair of transistors. Typically, such offset voltage is trimmed in this manner to reduce the magnitude of the offset voltage to as close as possible to zero volts. That is, such offset voltage is "nulled".

While such arrangement for adjusting the differential amplifier offset voltage of an integrated circuit is satisfactory in some applications, it is noted that after an individual integrated circuit chip or die is separated from the wafer, such chip typically is assembled into an integrated circuit package, such as a dual-in-line package (DIP), flatpack or TO-5 can, having a predetermined and limited number of package leads or pins. Thus, such an integrated circuit package typically does not provide leads or pins coupled to the chip-level pads of the offset-voltage-trimming zener diodes. That is, the pads for the offset-voltage-trimming zener diodes are not accessible through the leads of the package containing the integrated circuit differential amplifier. Thus, the above-described offset voltage adjustment is performed only at the integrated circuit wafer level, that is, before an individual integrated circuit chip or die is assembled into an integrated circuit package. Thus, compensation is not provided for changes in the offset voltage of the differential amplifier which are typically introduced during the separation of the integrated circuit wafer into dice (i.e., individual die), the assembly of an individual integrated circuit die into an IC package and the burn-in phase of the packaged integrated circuit. Thus, the offset voltage of the finally-packaged integrated circuit often has shifted by tens of microvolts from the offset voltage null obtained at the integrated circuit wafer level.

SUMMARY OF THE INVENTION

In accordance with the present invention, an integrated circuit is disposed in a package having an electrical interconnection lead, the integrated circuit comprising a differential amplifier having a nominal offset voltage. The differential amplifier further includes means, disposed in the package and coupled to the electrical interconnection lead, for adjusting the offset voltage of the differential amplifier from the nominal offset voltage in response to a control signal applied to the electrical interconnection lead. With such arrangement, the offset voltage may be adjusted after separating the integrated circuit from a wafer (containing, for example, a large array of identical integrated circuits), assembling the integrated circuit in an integrated circuit package, and "burning-in" the packaged integrated circuit, thereby compensating for changes in the offset voltage of the integrated circuit differential amplifier introduced during such separation, packaging and burn-in.

In a preferred embodiment of the present invention, the integrated circuit is disposed in a package having a plurality of electrical interconnection leads, a first one of the leads being adapted to receive an input signal during a normal operating mode of the integrated circuit. The integrated circuit comprises: a supply voltage bus coupled to a second interconnection lead and fed by a reference potential; a differential amplifier comprising a pair of emitter-coupled transistors and having a nominal offset voltage, the nominal offset voltage being a function of a nominal resistance coupled between a collector electrode of a first one of the pair of transistors and the reference potential; means for producing the nominal resistance, such producing means comprising a plurality of serially-coupled resistors; and, a network coupled between the supply voltage bus and said collector electrode. The network comprises: a first resistor nominally electrically decoupled from between the supply voltage bus and said collector electrode; switch means, responsive to a programming signal applied across the first and second interconnection leads during a programming mode of the integrated circuit, for electrically coupling the first resistor between the supply voltage bus and said collector electrode to change the offset voltage from the nominal offset voltage by a predetermined amount; and, control means operable during the programming mode to electrically couple the switch means between the first and second leads, and operable during the normal operating mode to electrically decouple the switch means from the first interconnection lead. With such arrangement, the offset voltage is trimmed using package leads which serve the dual function of: receiving input signals for the integrated circuit during the normal operating mode; and, receiving the programming signal during the programming mode for post-packaging trimming of the offset voltage.

The present invention also provides a process comprising the steps of: measuring the offset voltage of a differential amplifier of an integrated circuit disposed in a package, the offset voltage being a function of a resistance coupled between the differential amplifier and a reference potential; and, applying a programming signal to a lead of such package to electrically couple a previously electrically decoupled resistor between the differential amplifier and the reference potential to trim the measured offset voltage by a predetermined amount.

BRIEF DESCRIPTION OF THE DRAWINGS

The foregoing features of the present invention and the advantages thereof may be fully understood from the following detailed description read in conjunction with the acompanying drawings wherein.

DESCRIPTION OF THE PREFERRED EMBODIMENTS

Figure 1:
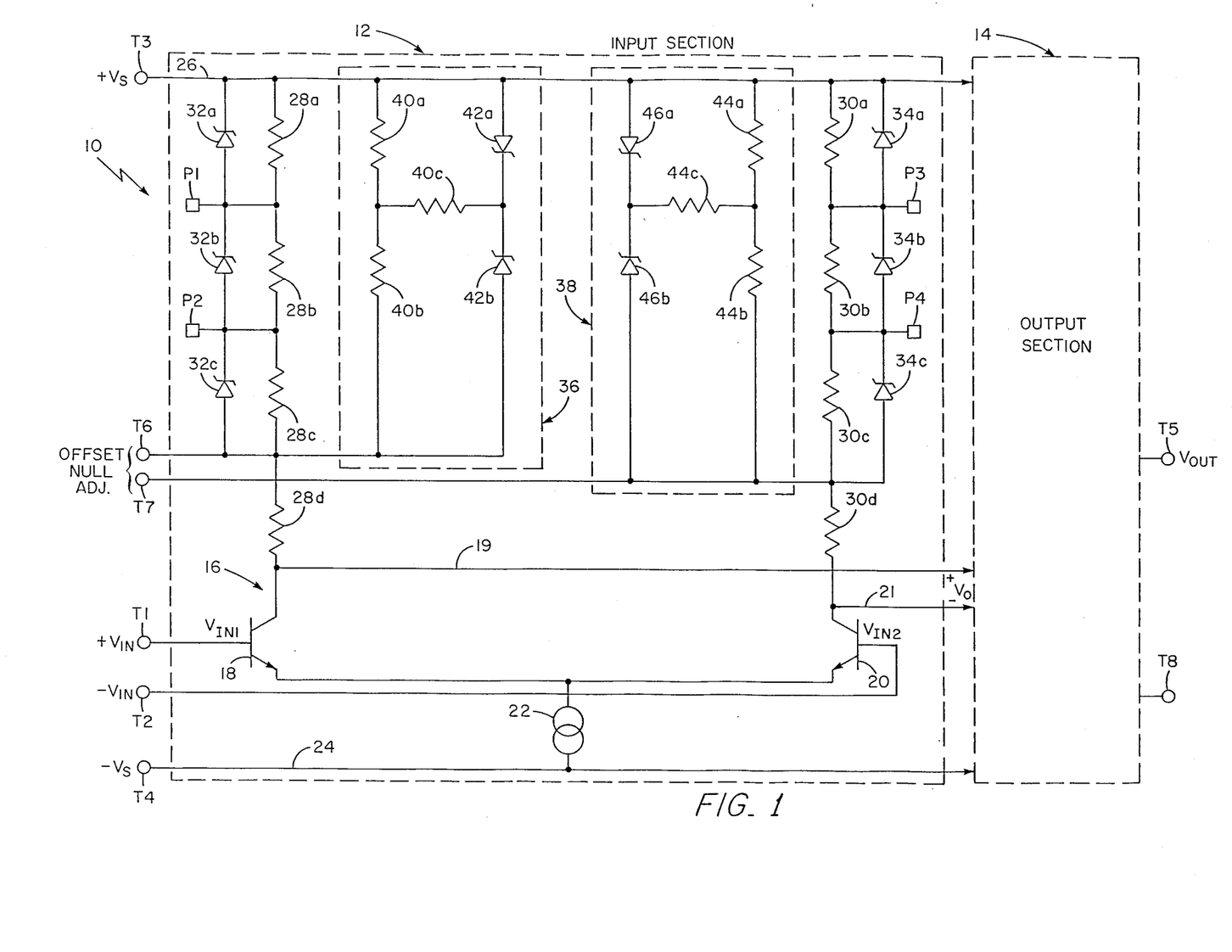
FIG. 1 is a schematic and block diagram of an integrated circuit embodying the offset voltage adjustment circuitry according to the present invention.

Referring now to FIG. 1, an integrated circuit (IC) 10, such as an operational amplifier (op amp), is schematically shown to comprise input section 12, output section 14 and terminals T1-T8. Integrated circuit 10 is here disposed in a conventional integrated circuit package (not shown), such as a dual-in-line package (DIP), flatpack or T0-5 can, with terminals T1-T8 being connected to the electrical interconnection leads or pins of such package. Input section 12 includes differential amplifier 16 comprising a pair of transistors 18, 20 and having a nominal offset voltage contributed, for example, by mismatches between transistors 18, 20 and packaging and burn-in of integrated circuit 10. Integrated circuit 10 comprises offset voltage trim networks 36, 38, electrically coupled to terminals T6, T7, respectively, and to terminal T3, for adjusting such offset voltage from the nominal offset voltage in response to a control or programming signal applied to such terminals from a source external to the package in a manner to be discussed in detail hereinafer. With such arrangement, the offset voltage of differential amplifier 16 may be trimmed after integrated circuit 10 is assembled into an IC package and after burn-in of such packaged integrated circuit, thereby providing integrated circuits having consistently lower offset voltages and hence more accurate devices. Also, such offset voltage is trimmed using package pins (coupled to terminals T3, T6, T7 in FIG. 1) which are present independently of such offset voltage adjustment and which receive input signals for integrated circuit 10 during the normal operation of integrated circuit 10 (for example, as an op amp), as is discussed in detail hereinafter.

Transistors 18, 20 here are bipolar n-p-n transistors, although it is understood that in complementary-polarity circuits p-n-p transistors may be substituted therefor. Transistors 18, 20 may alternately be field-effect-transistors (FETs) rather than bipolar transistors. The base electrodes of transistors 18, 20 are coupled to terminals T1, T2, respectively, which, as will be discussed, are coupled to the IC package pins assigned to receive the positive ($+V_{IN}$) and negative ($-V_{IN}$) input data signals applied to integrated circuit 10. The emitter electrodes of transistor pair 18, 20 are coupled together and to constant current source 22, such current source 22 also being coupled to first voltage bus 24, as shown. A second voltage bus 26 is coupled to the collector electrode of transistor 18 through a plurality of, here four, serially-coupled discrete resistors 28a, 28b, 28c, 28d. Likewise, serially-coupled resistors 30a, 30b, 30c, 30d are coupled between second voltage bus 26 and the collector electrode of transistor 20. Here, resistors 28d, 30d each form the bulk of the collector resistance of corresponding transistors 18, 20, with resistors 28a-28c and resistors 30a-30c having binarily weighted resistance values for purposes to be discussed. Resistors 28a-28d, 30a-30d are here thin film resistors for purposes to be discussed. Line 19 couples the collector electrode of transistor 18 to output section 14, with the collector electrode of transistor 20 being coupled to output section 14 along line 21, as shown. Also applied to output section 14 are first and second voltage buses 24, 26, respectively. Second voltage bus 26 is also connected to terminal T3 of integrated circuit 10. Terminal T4 of integrated circuit 10 is coupled to first voltage bus 24. Terminals T3, T4 are connected to a corresponding pair of IC package pins or leads and in operation are applied with input signals comprising the positive ($+V_s$) and negative ($-V_s$) operating potentials, respectively, for integrated circuit 10. The output of integrated circuit 10 is produced in a conventional manner by output section 14 at terminal T5 (i.e., signal $V_{OUT}$) in accordance with the signals applied thereto from transistors 18, 20.

Input section 12 also comprises a first set of zener diodes 32a, 32b, 32c coupled as shown in parallel with individual resistors 28a, 28b, 28c, respectively, for purposes to be discussed. Pad P1 is formed at the junction of the anode of zener diode 32a and the cathode of zener diode 32b. Similarly, pad P2 is disposed at the junction of the anode of zener diode 32b and the cathode of zener diode 32c, the anode of zener diode 32c being coupled to terminal T6. Terminal T3 is coupled to the cathode of zener diode 32a. Likewise, a second set of zener diodes 34a, 34b, 34c, are coupled in parallel across individual resistors 30a, 30b, 30c, respectively, as shown, with terminal T3 being coupled to the cathode of zener diode 34a and terminal T7 feeding the anode of zener diode 34c. Pads P3, P4 are formed electrically coupled to the junction between the anode and cathode electrodes of zener diodes 34a, 34b and 34b, 34c, respectively. Terminals T6, T7 constitute the offset-null adjustment terminals of integrated circuit 10 and, as discussed, are coupled to corresponding leads or pins of the package in which integrated circuit 10 is disposed. As is known, during the normal operation of integrated circuit 10, offset null adjustment terminals T6, T7 are fed by input signals from circuitry (not shown) external to packaged integrated circuit 10 to compensate for drifts in the offset voltage thereof due to, for example, temperature variations. Pads P1-P4, on the other hand, are contact points formed in a conventional manner on the individual chip or die (not shown) on which integrated circuit 10 is formed, and terminate on such integrated circuit chip. To put it another way, pads P1–P4 are not connected directly to any of terminals T1–T8 and hence are not connected to the interconnection leads or pins of the package in which integrated circuit 10 is disposed.

Post-packaging offset voltage trim networks 36, 38 are coupled as shown between second voltage bus 26 (and hence terminal T3) and offset null terminals T6, T7, respectively. Specifically, trim network 36 comprises resistors 40a, 40b serially-coupled together at first ends thereof, with the second end of resistor 40a being coupled to voltage bus 26 and the second end of resistor 40b connected to the junction of: terminal T6; the anode of zener diode 32c; and resistors 28c, 28d. Coupled in parallel across resistors 40a, 40b are "back-to-back" zener diodes 42a, 42b. That is, here zener diodes 42a 42b are connected together at the cathode electrodes thereof. As is discussed hereinafter, zener diode 42a is analagous to a normally open switch. The anode electrode of zener 42a is fed by voltage bus 26 and the anode electrode of zener diode 42b is coupled to the second end of resistor 40b. Thus, the anodes of zener diodes 42a, 42b are electrically connected to terminals T3, T6, respectively. Resistor 40c is coupled between the junction of resistors 40a, 40b and the cathodes of zener diodes 42a, 42b, as shown. Trim network 38 comprises resistors 44a, 44b serially-coupled together at first ends thereof, with the second end of resistor 44a being coupled to second voltage bus 26 and the second end of resistor 44b connected to the junction of: terminal T7; the anode of electrode zener diode 34c; and resistors 30c, 30d. Network 38 also comprises back-to-back zener diodes 46a, 46b, here coupled together at the cathode electrodes thereof, such cathodes being further coupled to the junction of resistors 44a, 44b through resistor 44c. The anode electrode of zener diode 46a is coupled to voltage bus 26. The anode electrode of zener diode 46b is connected to the second end of resistor 44b. Thus, the anodes of zener diodes 46a, 46b are electrically connected to terminals T3, T7, respectively. It is noted that resistors 40a–40c, 44a–44c here are thin film resistors. It is further noted that trim networks 36, 38 are coupled to respective differential pair transistors 18, 20 through resistors 28d, 30d, respectively, and that each one of trim networks 36, 38 is electrically connected to a pair of terminals of integrated circuit chip 10. That is, trim network 36 is connected to terminals T3, T6, and trim network 38 is connected to terminals T3, T7. Thus, since terminals T3, T6, T7 are connected to corresponding leads or pins of the package containing integrated circuit 10, it is seen that trim networks 36, 38 are accessible via the package pins connected to terminals T3, T6 and T3, T7, respectively.

In operation, and as discussed, during the fabrication of integrated circuit 10 on an individual die (not shown) on a wafer (not shown) typically containing a large array of identical dice, mismatches are unavoidably introduced in the structural characteristics of differential pair transistors 18, 20, for example, differences between the dopant concentrations, base widths and emitter areas thereof. Such fabrication-induced mismatches between transistor pair 18, 20 produce a finite differential output voltage between the collector electrodes of transistors 18, 20 when zero volts is applied to the base electrodes thereof. Thus, an offset voltage ($V_{os}$), for example 500 microvolts ($\mu V$), must be introduced between the input voltage $V_{IN1}$, $V_{IN2}$ applied to the base electrodes of transistors 18, 20, respectively, to set such differential output voltage $V_o$ to zero volts. As is known, the offset voltage, $V_{os}$, obeys the following equation:

$$V_{os} = V_{IN1} - V_{IN2} \quad (1)$$

$$V_{os} = \frac{KT}{q} \ln \frac{RC1(A1)}{RC2(A2)}$$

where K is Boltzmann's constant, T represents absolute temperature (° K) and q is the charge of an electron. The quantity RC1 is the equivalent collector resistance of transistor 18, with the equivalent collector resistance of transistor 20 being represented by RC2. The values A1 and A2 represent the emitter areas of transistors 18, 20, respectively. Thus, it is seen from equation (1) that the offset voltage $V_{os}$ of differential amplifier 16 may be adjusted or trimmed by changing the effective values of the collector resistances of transistors 18, 20. As may be seen from inspection of FIG. 1, the collector resistance of transistor 18 (RC1) is determined by resistors 28a–28d and 40a–40c. Likewise, the collector resistance of transistor 20 (RC2) is determined by resistors 30a–30d 44a–44c.

The offset voltage $V_{os}$ of differential amplifier 16 is initially nulled (i.e., adjusted to be as close as possible to zero volts) while integrated circuit 10 is still at the wafer level, that is, before the individual chip or die containing integrated circuit 10 has been separated from the wafer and assembled into an IC package. Pads P1–P4 and terminals T3, T6, T7 are utilized for such initial adjustment of $V_{os}$. The magnitude and polarity of $V_{os}$ is measured between lines 19, 21 (i.e., between the collector electrodes of differential pair transistors 18, 20) in a conventional manner. For example, a selected one of the input terminals T1, T2 of integrated circuit 10 is grounded, and the output terminal T5 of the circuit 10 is also forced to zero volts. The magnitude and polarity fo the voltage measured at the other input terminal T1, T2 represents the offset voltage $V_{os}$ of differential amplifier 16. A selected one, or ones, of collector resistors 28a, 28b, 28c or 30a, 30b, 30c are electrically bypassed according to the magnitude and polarity of such offset voltage by individually shortcircuiting a corresponding one, or ones, of zener diodes 32a, 32b, 32c or 34a, 34b, 34c using the corresponding pads P1–P4 and terminals T3, T6, T7 coupled thereto, to thereby adjust the measured offset voltage $V_{os}$ to be as close as possible to zero volts, that is, to "null" $V_{os}$. For example, to bypass resistor 28a, a large (such as 20 volts) reverse bias voltage is introduced across zener diode 32a using pad P1 and terminal T3, that is, pad P1 is made highly negative with respect to terminal T3. Such reverse-bias potential produces a large reverse current through zener diode 32a, fusing the metal contacts (not shown) of such zener diode 32a together by electro-migration and thus permanently short-circuiting zener diode 32a, thereby electrically bypassing resistor 28a. That is, voltage bus 26 is coupled direcly to a first end of resistor 28b through short-circuited zener diode 32a, thereby effectively removing resistor 28a from the collector resistance of transistor 18. If required, resistor 28b may be electrically bypassed in a similar manner to remove resistor 28b from the collector resistance of transistor 18 by introducing a large reverse-bias voltage across pads P1 and P2. Likewise, applying a large reverse-bias voltage between pad P2 and terminal T6 will permanently short-circuit zener diode 34c and thus electrically bypass resistor 28c. The collector resistance of transistor 20 may be similarly adjusted using pads P3, P4 and terminals T3 and T7. Thus, applying a large reverse-bias voltage between P3 and T3 short-circuits zener diode 34a, electrically bypassing resistor 30a. Also, resistor 30b may be electrically bypassed by applying a large reverse bias voltage across pads P3, P4, thereby permanently short-circuiting zener diode 34b. Similarly, applying a large reverse-bias voltage between pad P4 and terminal T7 permanently short-circuits zener diode 34c and electrically bypasses resistor 30c. As discussed, the values of resistors 28a–28c, 30a–30c are here binarily weighted in a known manner to provide suitable range and resolution for the adjustment of such collector resistances. Thus, by short-circuiting a selected one, or ones, of zener diodes 32a–32c, 34a–34c according to the polarity and magnitude of the measured offset voltage of differential amplifier 16, such offset voltage is nulled at the wafer level of integrated circuit 10, that is, adjusted to be as close as possible to zero volts. Here, such wafer-level adjustment provides an offset voltage on the order of 40 microvolts ($\mu$V). It is noted that additional resistors, some or all having zener diodes and associated pads coupled in parallel therewith, may be serially-coupled with resistors 28a–28d or 30a–30d between voltage bus 26 and the collector electrodes of transistors 18 or 20, respectively, to further increase the available range and resolution of the wafer-level adjustment of the collector resistances of transistors 18, 20, and hence the offset voltage of differential amplifier 16.

After initial adjustment of $V_{os}$ in the manner described above, the integrated circuit wafer comprising the individual chip or die on which integrated circuit 10 has been formed and an array of identical dice is scribed and separated into individual dice. The individual integrated circuit chip or die embodying integrated circuit 10 is assembled in an IC package (not shown) such as a DIP, flatpack or T0-5 can. The IC package has a predetermined number of electrical interconnection pins or leads, such IC package here having eight pins, seven of which are connected in a conventional manner to terminals T1–T7. The eighth IC lead may be left unconnected or may be coupled to terminal T8 and used to provide, for example, frequency compensation for integrated circuit 10, as is known. The IC package may, of course, have more than eight pins, depending on the application for which integrated circuit 10 is to be used. It is noted, however, that pads P1–P4 are conventionally not coupled directly to leads of the IC package. That is, interconnection pins are not typically provided on an IC package dedicated to one or more of offset-voltage-adjustment-pads P1–P4. Thus, after integrated circuit 10 is assembled in the IC package, the previously unselected one, or ones, of zener diodes 32a–32c, 34a–34c which were not short-circuited during the adjustment of the offset voltage $V_{os}$ at the wafer level may not be accessed for selective short-circuiting to further adjust the collector resistances of differential transistor pair 18, 20 and the offset voltage of differential amplifier 16.

It has been found that the offset voltage $V_{os}$ of integrated circuit differential amplifier 16 shifts by as much as 20 $\mu$V from the value to which $V_{os}$ was adjusted at the wafer level (i.e. 40 $\mu$V) during the process of separating the wafer into individual dice or chips and assembling the die containing integrated circuit 10 in an IC package. Additional shifts on the order of 20 $\mu$V occur in $V_{os}$ during the conventional burn-in process of packaged integrated circuit 10. Thus, depending on the polarity of the shift in $V_{os}$, after burn-in the packaged integrated circuit 10 may have an offset voltage of twice that obtained during the above-described wafer-level adjustment (i.e., 80 $\mu$V as compared to 40 $\mu$V). As discussed above, such shifts in $V_{os}$ may not be compensated for by selectively electrically bypassing previously unselected ones of resistors 28a–28c, 30a–30c by selectively short-circuiting corresponding zener diodes 32a–32c, 34a–34c, since the pads P1–P4 for such zener diodes 32a–32c, 34a–34c, are not electrically accessible via package leads on packaged integrated curcuit 10.

The present invention provides adjustment of the offset voltage $V_{os}$ after packaging of integrated circuit 10 in an IC package by providing networks 36, 38 coupled between second voltage bus 26 and the collectors of transistors 18, 20, such networks 36, 38 being accessible in the packaged integrated circuit 10 via the already existing offset-null adjustment pins (coupled to terminals T6, T7) and the package pin coupled to terminal T3. That is, the present invention provides adjustment of $V_{os}$ after packaging of integrated circuit 10 without requiring additional pins or leads on such package to perform such $V_{os}$ adjustment. Additionally, post-packaging offset voltage adjustment is provided utilizing package pins which have other functions during the normal operation of integrated circuit 10, as will be explained. Suffice it here to say that during the normal operating mode of integrated circuit 10 the package lead coupled to terminal T3 is fed by positive supply voltage $+V_s$ and the package leads coupled to terminals T6, T7 receive input signals to adjust the offset null of integrated circuit 10, whereas during a "programming" mode in which the offset voltage of packaged integrated circuit 10 is trimmed by networks 36, 38, programming or control signals are applied to such leads connected to terminals T3, T6, T7.

It is noted that after the above-described wafer-level adjustment of $V_{os}$, the nominal collector resistance of transistor 18 is the resistance of resistor 28d plus the parallel combination of: (1) the series resistance of the non-electrically bypassed resistors 28a–28c ; and (2) the series sum of resistors 40a, 40b. Likewise, the effective nominal collector resistance of transistor 20 is the resistance of resistor 30d plus the parallel combination of: (1) the series resistance of the non-electrically bypassed resistors 30a–30c; and (2) the series sum of resistors 44a, 44b. Resistors 40c and 44c are both nominally electrically decoupled from respective transistors 18, 20 by zener diodes 42a, 42b and 46a, 46b, respectively. After the die embodying integrated circuit 10 is separated from the wafer and assembled in the IC package, and after burn-in of the packaged integrated circuit 10, the offset voltage $V_{os}$ of differential amplifier 16 is measured again in the manner discussed above. If the level and polarity of such measured offset voltage is such that changing the effective collector resistance of transistor 18, for example, will compensate for the shift in $V_{os}$ due to packaging and burn-in, such collector resistance of transistor 18 is incrementally adjusted in the present invention by applying a "programming" or control signal, comprising a relatively large potential (e.g., +20 volts), across the IC package leads connected to terminals T6, T3 for a predetermined time. That is, terminal T6 is made 20 volts more positive than terminal T3.

Thus, zener diode 42b conducts as a forward-biased device and couples such programming signal across zener diode 42a, thereby highly reverse-biasing zener diode 42a. The level of the programming signal here is selected to be sufficient to permanently short-circuit reverse-biased zener diode 42a due to metal electromigration (the same effect that short-circuited selected zener diodes 32a, 32b, 32c during the wafer level adjustment of $V_{os}$), thereby providing a permanent short-circuit between the second ends of resistors 40a, 40c and thus placing such resistors 40a, 40c in parallel. In other words, resistor 40c is electrically coupled between voltage bus 26 and the collector of transistor 18 in parallel with resistor 40a in response to the programming signal applied to terminals T6, T3. Thus, zener diode 42a is analagous to a normally open switch or an "anti-fuse" which is permanently closed or "fused" in response to the programming signal. It has been found that the reverse-biased zener diode 42a will short-circuit before the forward-biased zener diode 42b because a higher electric field intensity exists in such reverse-biased zener diode 42a. The large potential between T6, T3 is removed after zener 42a short-circuits and before zener 42b has time to short-circuit. Parenthetically, it is noted that the one, or ones, of zener diodes 32a, 32b, 32c not short-circuited via terminals T3, T6 and pads P1, P2 during the initial, wafer-level adjustment of $V_{os}$ is forward-biased similarly as zener diode 42b when the programming signal is applied across the IC package pins coupled to terminals T6, T3. Thus, such zener diodes 32a, 32b, 32c are not short-circuited by such programming signal.

On the other hand, if after packaging and burn-in the offset voltage of integrated circuit 10 is found to have shifted so as to require adjustment of the effective collector resistance of transistor 20 to compensate for such shift, such resistance is adjusted in the present invention by accessing network 38 via the package leads connected to offset null adjustment terminal T7 and supply terminal T3 with a similar programming signal. Terminal T7 is made highly positive (e.g., by 20 volts) with respect to T3 for a predetermined time, thereby forward-biasing zener diode 46b (and also the previously unshorted one, or ones, of zener diodes 34a, 34b, 34c) and reverse-biasing zener diode 46a. Such reverse-biased zener diode 46a permanently short-circuits in response to such programming signal, thereby coupling resistor 44c in parallel with resistor 44a. To put it another way, resistor 44c is electrically coupled between voltage bus 26 and the collector of transistor 20 in response to the programming signal applied to terminals T7, T3. The predetermined time period of the programming signal is selected to remove such programming signal from terminals T7, T3 before such signal has time to short circuit zener diode 46b (or previously unshorted zener diodes 34a, 34b, 34c).

Thus, it is seen that the present invention provides adjustment of the offset voltage $V_{os}$ of differential amplifier 16 after integrated circuit 10 is packaged (i.e., post-packaging) by permitting adjustment of the effective collector resistances of differential amplifier transistors 18, 20 through previously existing package leads or pins connected to terminals T6, T7 and T3 of such IC package. That is, such adjustment is made using pins on the IC package that are present independently of the $V_{os}$ adjustment circuitry, such pins being represented in the embodiment of FIG. 1 as: the positive supply voltage ($+V_s$) pin (coupled to terminal T3); and the offset-null adjustment pins (coupled to terminals T6, T7). Thus, no additional leads are required on such IC package 10 to enable the post-packaging trim of the offset voltage $V_{os}$ according to the present invention.

It must be noted that although networks 36, 38 have been described here as relatively simple circuits comprising three resistors and two zener diodes, it is understood that such networks 36, 38 may be expanded to include additional resistor and zener diode elements. The values of resistors 40a-40c, 44a-44c may be selected empirically to provide adjustment of the collector resistance of transistors 18, 20 in an amount proportional to the expected shift of $V_{os}$ due to packaging and burn-in of integrated circuit 10.

During the normal operation of integrated circuit 10, here as an op amp, a positive supply voltage $+V_s$ here, 15 volts DC, is applied to the IC package lead connected to terminal T3. The IC package lead connected to T4 is fed by a supply voltage $-V_s$ (which may be ground potential). Here, conventional external offset null adjustment circuitry (not shown), such as a potentiometer having a center tap fed by a reference potential, is coupled to integrated circuit 10, such as by coupling a pair of end taps of such potentiometer to the package leads connected to terminals T6, T7. A pair of input signals $+V_{IN}$, $-V_{IN}$ applied to the IC package leads coupled to terminals T1, T2, respectively, are amplified by differential amplifier 16 to produce a differential voltage signal $V_o$ between the collector electrodes thereof representative of the difference between such input signals $+V_{IN}$, $-V_{IN}$. Such differential signal $V_o$ is fed to conventional output section 14 via lines 19, 21, where such signal $V_o$ is converted in a conventional manner to a single-ended output signal $V_{OUT}$ at terminal T5. Such terminal T5 is connected to an IC package lead which here is coupled, for example, to a load (not shown) and/or feedback circuitry (not shown) external to the IC package. During such normal operating mode, the nominal voltage drop from voltage bus 26 to terminals T6, T7 is less than 0.5 volts. Thus, the unshorted ones of zener diodes 32a-32c, 34a-34c, 42a, 46a, and zener diodes 42b, 46b, are all nonconducting during the normal operation of integrated circuit 10 and do not interfere either with the operation of such integrated circuit 10 as, for example, an op amp or comparator, or with such external offset null adjustment circuitry. That is, the nominal 0.5 volt potential drop between terminals T3, T6 and terminals T3, T7 is insufficient to forward-bias zener diodes 42a, 46a (assuming such zener diodes 42a, 46a have not been "programmed" to be short-circuited in the manner described above), thereby electrically isolating the first ends of resistors 40c, 44c (coupled to the cathodes of zener diodes 42a, 46a, respectively) from voltage bus 26 and terminal T3. The 0.5 volt potential difference also reverse biases zener diodes 42b, 46b, such nominally reversed-biased diodes 42b, 46b creating a high impedance between terminal T6 and the cathode of zener diode 42a, and between terminal T7 and the cathode of zener diode 46a, respectively. Further, the level of the offset null adjustment input signals applied to terminals T6, T7 during the normal operating mode is selected to be insufficient, with respect to $+V_s$, to forward bias zener diodes 42b, 46b. Thus, zener diodes 42b, 46b function as control means to electrically decouple the input signals at terminals T6, T7 from zener diodes 42a, 46b, respectively, during the normal operating mode of integrated circuit 10, while coupling the 20 volt programming signals at terminals T6, T7 to zener diodes 42a, 46a during the programming mode to trim the offset offset voltage of differential amplifier 16.

It should be noted that resistors 28a–28d, 30a–30d, 40a–40c and 44a–44c have applied across them a first voltage polarity during the programming mode of $V_{os}$ and a second voltage polarity during the normal operating mode of integrated circuit 10. That is, during post-packaging adjustment of $V_{os}$, terminal T3 is made highly negative with respect to a selected one, or ones, of offset null terminals T6, T7, while during normal operation, when $+V_s$ is coupled to T3, such terminal T3 is positive with respect to terminals T6, T7. Thus, resistors 28a–28d, 30a–30d, 40a–40c and 44a–44c should be thin-film resistors or an equivalent type of resistor, the resistance characteristics of which are not significantly affected by the polarity of the voltage applied thereto. Thus, diffused or ion-implanted resistors, which for example comprise a p-type region disposed in an n-type tub biased at $+V_s$ (and therefore are coupled to $+V_s$ via an intrinsic reverse-biased diode) are unsuitable for use as resistors 28a–28d, 30a–30d, 40a–40c, 44a–44c, since the intrinsic reverse-biased diode thereof would clamp the maximum voltage at either end of the resistor to $+V_s$ plus one diode drop. This would prevent the full magnitude of the programming signal (for example, 20 volts) from appearing at an end of the resistor, thereby precluding such programming signal from short-circuiting a selected zener diode and preventing adjustment of $V_{os}$ utilizing such zener diodes.

Figure 2:
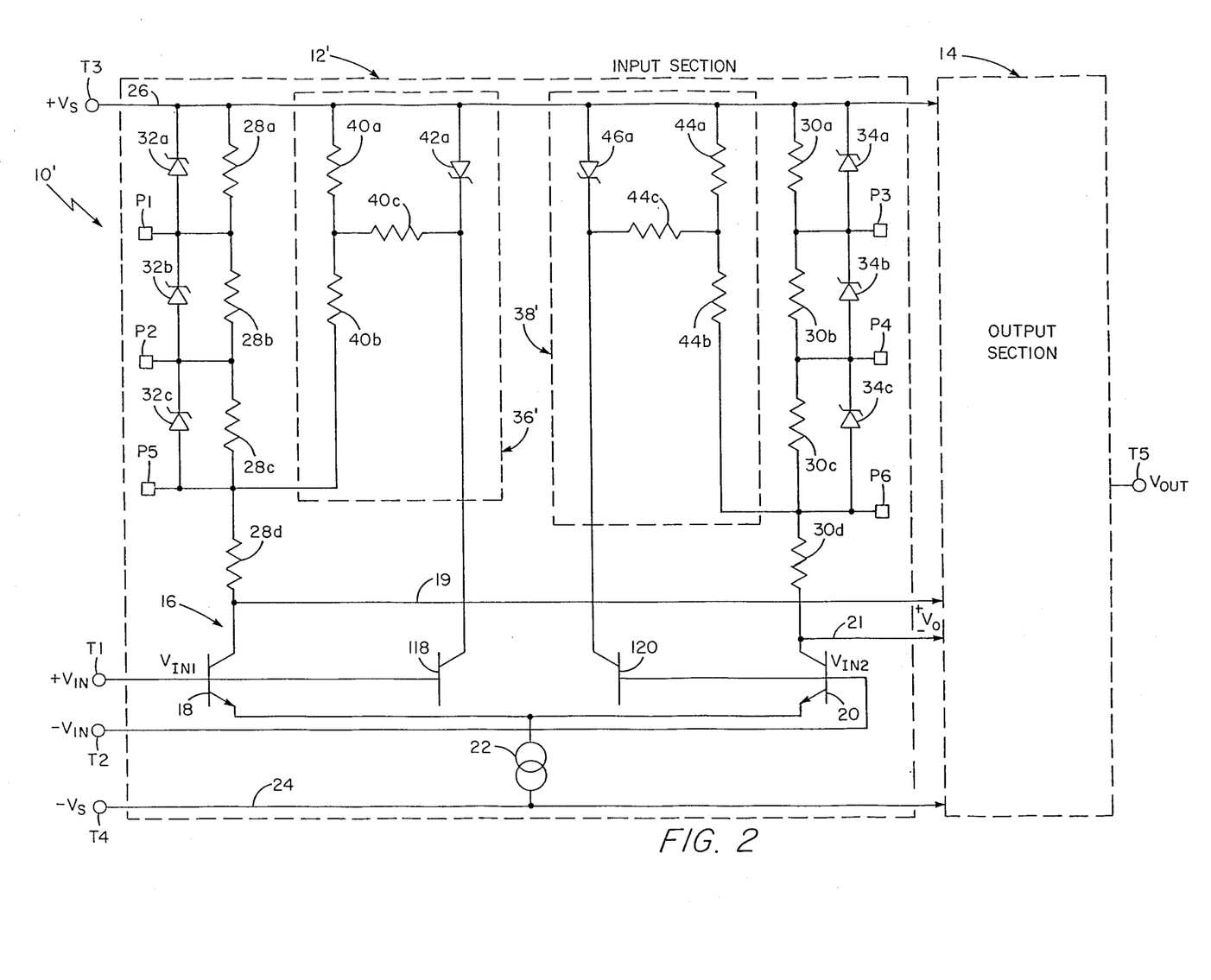
FIG. 2 is a schematic and block diagram of an integrated circuit embodying the offset voltage adjustment circuitry according to a second embodiment of the present invention.

The present invention is not limited to post-packaging trimming of the offset voltage of an integrated circuit differential amplifier using package pins connected to offset null terminals (i.e., terminals T6, T7 of FIG. 1). FIG. 2 shows an integrated circuit 10' in which the offset voltage $V_{os}$ of differential transistor pair 18, 20 is trimmed with modified post-packaging trimming networks 36', 38' utilizing the data input signal terminals T1, T2 and supply terminal T3. No offset null adjustment terminals (i.e., T6, T7 of FIG. 1) are needed in integrated circuit 10'. Networks 36', 38' are modified from networks 36, 38 of FIG. 1 by replacing zener diodes 42b, 46b (FIG. 1) with transistors 118, 120, as shown. Specifically, transistor 118, here comprising a bipolar transistor without an emitter region and shown separate from network 36' for clarity, has a base electrode coupled to input terminal T1 and to the base electrode of transistor 18. The collector electrode of transistor 118 is coupled to the cathode electrode of zener diode 42a and resistor 40c. Similarly, transistor 120 (shown separate from network 38' for clarity) is here also a bipolar transistor without an emitter region and comprises a base electrode coupled to input terminal T2 and to the base electrode of transistor 20. The collector electrode of transistor 120 is coupled to the junction of resistor 44c and the cathode of zener diode 46a. Voltage bus 26, from terminal T3, is coupled to networks 36', 38', as shown. Resistors 40c, 44c are nominally electrically decoupled from transistors 18, 20 by zener diode 42a and transistor 118 and by zener diode 46a and transistor 120, respectively.

At the wafer level, the offset voltage of integrated circuit 10' is adjusted (i.e., nulled) in the same manner as previously discussed. Thus, selected collector resistors 28a–28c, 30a–30c are electrically bypassed by short-circuiting corresponding zener diodes 32a–32c, 34a–34c with reverse-bias programming signals. It is noted that since integrated circuit 10' does not provide offset null terminals (i.e., terminals T6, T7 of FIG. 1), pads P5, P6 are provided in integrated circuit 10' coupled to the anodes of zener diodes 32c, 34c, respectively, to enable the wafer-level reverse-bias programming signal to be applied thereacross.

An individual IC chip or die containing integrated circuit 10' is subsequently packaged in a convention package (not shown), such as a DIP, flatpack or TO-5 can, having leads or pins electrically connected to terminals T1–T5 of such integrated circuit 10'. It is noted that package leads or pins are not provided to enable access to zener diodes 32a–32c, 34a–34c for further offset voltage adjustment using such diodes after packaging of integrated circuit 10'.

However, terminals T1, T2, which function ordinarily as input signal terminals for differential amplifier 16, are seen in FIG. 2 to be electrically coupled to transistors 118, 120, respectively, of post-package trim networks 36', 38'. Thus, networks 36', 38' are accessible in the packaged integrated circuit 10' via already-existing package pins connected to terminals T1, T2 and the package pin connected to supply voltage terminal T3. Thus, if after packaging and burn-in of integrated circuit 10' the offset voltage $V_{os}$ thereof has a level and polarity requriring a change in the effective collector resistance of transistor 18, for example, a programming signal, comprising a relatively large potential such as +20 volts, is applied across the IC package leads connected to terminals T1, T3 for a predetermined time. That is, terminal T1 is made highly positive with respect to terminal T3. Transistor 118 is highly forward-biased between the base (p-type) and collector (n-type) thereof and zener diode 42a becomes highly reverse-biased. Such high reverse biasing is sufficient to permanently short-circuit zener diode 42a due to the aforementioned metal electro-migration effect, thereby electrically coupling resistors 40a, 40c in parallel and incrementally changing the effective collector resistance of transistor 18, thus trimming the offset voltage of differential amplifier 16. It has been found that reverse-biased zener diode 42a will short-circuit before the forward-biased base-collector junction of transistor 118 due to the higher electric field intensity that exists in the reverse-biased P-N junction of zener diode 42a. The programming signal is removed from terminals T1, T3 after zener diode 42a short circuits and before transistor 118 has time to short circuit.

Alternately, the offset voltage of differential amplifier 16 may be incrementally adjusted in the opposite direction by applying the programming signal between the package pin connected to input terminal T2 and the pin coupled to terminal T3. The base (p-type) collector n-type) junction of transistor 120 becomes forward-biased, with zener diode 46b becoming highly reverse-biased, thereby short-circuiting zener diode 46b before transistor 120 has time to short circuit. Thus, transistors 44a, 44c become electrically coupled in parallel, thereby incrementally changing the effective collector resistance of transistor 20 and trimming the offset voltage of the differential amplifier 16 of packaged integrated circuit 10'.

Parenthetically, it is noted that the level of the input signals applied to terminals T1, T2 during the normal operating mode is typically a few volts, whereas the programming signal level is typically much higher (e.g. 20 volts). Transistors 18, 20 are selected to have a very high breakdown voltage across the base-collector junctions thereof, such as 80 volts. Thus, a little thought reveals that trimming networks 36', 38' are isolated from the inputs of differential amplifier 16 (i.e., the base electrodes of transistors 18, 20) during normal operation and thus do not interfere with the normal functioning of integrated circuit 10'. That is, during the normal operating mode of integrated circuit 10, transistors 118, 120 function as control elements to electrically decouple input signals at terminals T1, T2 from zener diodes 42a, 46a, respectively while during the programming mode, such transistors 118, 120 electrically couple the 20 volt programming signals at terminal T1 or T2 to corresponding zener diode 42a or 46a for trimming $V_{os}$ in the manner described above.

Having described preferred embodiments of the present invention, modifications and alterations thereto may become apparent to those skilled in the art. Therefore, it is understood that the present invention is to be limited only by the scope of the appended claims.

What is claimed is:

1. In combination:
    a package comprising electrical interconnection lead means for receiving a control signal during a first mode of operation and for receiving an input signal during a second mode of operation;
    an integrated circuit disposed in said package, such integrated circuit comprising a differential amplifier having a nominal offset voltage; and
    wherein the integrated circuit includes means, coupled to the electrical interconnection lead means, for adjusting the offset voltage of the differential amplifier from the nominal offset voltage in response to the control signal, said adjusting means being unresponsive to the input signal.

2. The combination of claim 1 wherein the differential amplifier comprises a nominal resistance coupled between the differential amplifier and a supply voltage bus, the nominal offset voltage being a function of the nominal resistance, said offset voltage adjusting means comprising:
    a resistor nominally electrically decoupled from the resistance;
    switch means for electrically coupling the resistor to the resistance in response to the control signal; and
    control means, coupled between said electrical interconnection lead means and the switch means, for electrically coupling said electrical interconnection lead means to the switch means when the control signal is applied to said interconnection lead means, and for electrically decoupling said interconnection lead means from the switch means when the input signal is applied to said interconnection lead means.

3. The combination of claim 2 wherein a first end of the resistor is electrically coupled to the resistance, and wherein the switch means comprises:
    diode means coupled between a second end of the resistor and the supply voltage bus, said diode means nominally electrically decoupling the second end of the resistor from the supply voltage bus and electrically coupling the second end of the resistor to the supply voltage bus in response to the control signal.

4. The combination of claim 3 wherein said control means comprises:
    a P-N junction adapted to be electrically nonconducting in response to the input signal and electrically conductive in response to the control signal.

5. The combination of claim 4 wherein said P-N junction comprises a zener diode.

6. The combination of claim 3 wherein said diode means comprises a zener diode.

7. An integrated circuit disposed in a package having a plurality of electrical interconnection leads, a first one of the plurality of electrical interconnection leads being adapted to receive an input signal during a normal operating mode of the integrated circuit, such integrated circuit comprising:
    (a) a supply voltage bus coupled to a second one of the plurality of interconnection leads and fed by a reference potential;
    (b) a differential amplifier comprising a pair of emitter-coupled transistors, said differential amplifier having a nominal offset voltage, said nominal offset voltage being a function of a nominal resistance between the collector electrode of a first one of the pair of emitter-coupled transistors and the reference potential;
    (c) means for producing the nominal resistance, such nominal resistance producing means comprising a plurality of serially-coupled resistors; and
    (d) a network coupled between the supply voltage bus and said collector electrode of said first one of said pair of emitter-coupled transistors, such network comprising:
        (i) a first resistor nominally electrically decoupled from between the supply voltage bus and said collector electrode;
        (ii) switch means, responsive to a programming signal applied across said first and second ones of the plurality of interconnection leads during a programming mode of the integrated circuit, for electrically coupling the first resistor between the supply voltage bus and said collector electrode to change the offset voltage from the nominal offset voltage by a predetermined amount; and
        (iii) control means operable during the programming mode to electrically couple the switch means to said first one of the plurality of interconnection leads, and operable during the normal operating mode to electrically decouple the switch means from said first one of the plurality of interconnection leads.

8. The integrated circuit of claim 7 wherein the first resistor is electrically coupled to said collector electrode at a first end thereof, and wherein the switch means comprises:
    a zener diode coupled between a second end of the first resistor and the supply voltage bus.

9. The integrated circuit of claim 8 wherein the control means comprises a P-N junction coupled between the first one of the interconnection leads and the second end of the first resistor, the level and magnitude of the input signal being selected to be insufficient to make said P-N junction electrically conductive, the level of the programming signal being selected to forward bias the P-N junction to be electrically conducting.

10. The integrated circuit of claim 9 wherein the level of the programming signal is further selected to reverse-bias said zener diode sufficiently to permanently short-circuit said zener diode.

11. The integrated circuit of claim 10 wherein said first interconnection lead is electrically coupled to the plurality of serially coupled resistors and said P-N junction is electrically coupled between the plurality of resistors and the second end of the first resistor.

12. The integrated circuit of claim 11 wherein said P-N junction comprises a second zener diode.

13. The integrated circuit of claim 10 wherein said first interconnection lead is electrically coupled to the base electrode of said first one of the pair of emitter-coupled transmitters, and wherein said P-N junction is coupled between said base electrode and the second end of the first resistor.

14. The integrated circuit of claim 13 wherein said P-N junction comprises a third transistor having a base electrode coupled to said base electrode of said first one of the pair of emitter-coupled transistors, the collector of said third transistor being coupled to said second end of the first resistor.

15. The integrated circuit of claim 14 wherein said third transistor is provided without an emitter.

16. The integrated circuit of claim 7 wherein said plurality of resistors and said first resistor are thin-film resistors.

17. In combination:
a package comprising electrical interconnection lead means for receiving an input signal having a first level during a first operating mode and for receiving a control signal having a second different level during a second operating mode; and
an integrated circuit disposed in the package, said integrated circuit comprising: a differential amplifier having a nominal offset voltage; and, means, coupled to said interconnection lead means, for trimming the offset voltage from the nominal offset voltage in response to the control signal, said trimming means being unresponsive to the input signal.

18. The combination of claim 17 wherein the input signal further comprising an offset null adjustment terminal coupled to said differential amplifier, said interconnection lead means being coupled to said offset null adjustment terminal.

19. The combination of claim 17 wherein the interconnection lead means is coupled to an input terminal of the differential amplifier, said differential amplifier producing an output signal in response to the input signal during the first operating mode.

20. The combination of claim 17 wherein the differential amplifier comprises a pair of transistors and a first resistor coupled between the collector electrode of a first one of the pair of transistors and a reference potential, bus the nominal offset voltage being a function of the resistance of the first resistor, and wherein the offset voltage trimming means comprises:
a second resistor nominally electrically decoupled from between said collector electrode and reference potential bus;
switch means for electrically coupling the second resistor between said collector electrode and reference potential bus in response to the control signal to trim the offset voltage from the nominal offset voltage; and
control means for electrically coupling the control signal to the switch means and for electrically decoupling the input signal from the switch means.

21. The combination of claim 20 wherein said switch means comprises a zener diode coupled between a first end of the second resistor and the reference potential bus, said zener diode being selected to become a permanent substantially short-circuit in response to the control signal.

22. The combination of claim 21 wherein the electrical interconnection lead means is electrically coupled to said collector electrode and the control means comprises a P-N junction coupled between said interconnection lead means and the zener diode, the P-N junction being selected to become forward-biased in response to the second level of the control signal and substantially nonconducting in response to the first level of the input signal.

23. The combination of claim 22 wherein the P-N junction comprises a second zener diode.

24. The combination of claim 21 wherein the electrical interconnection lead means is electrically coupled to the base electrode of said first one of the pair of transistors and the control means comprises a P-N junction coupled between said interconnection lead means and the zener diode, the P-N junction being selected to become forward-biased in response to the second level of the control signal and substantially nonconducting in response to the first level of the input signal.

25. The combination of claim 24 wherein said P-N junction comprises a third transistor having a base electrode coupled to said base electrode of said first one of the pair of transistors and having a collector electrode coupled to said zener diode.

26. The combination of claim 20 wherein said first and second resistors comprise thin film resistors.

27. A process comprising the steps of:
(a) measuring the offset voltage of a differential amplifier of an integrated circuit disposed in a package, the offset voltage being a function of a resistance coupled between the differential amplifier and a reference potential; and
(b) applying a programming signal to a lead of such package to electrically couple a previously electrically decoupled resistor between the different amplifier and the reference potential to trim the measured offset voltage by a predetermined amount.

28. In combination:
a package having electrical interconnection lead means for receiving a control signal during a first mode of operation and an input signal during a second mode of operation; and
an integrated circuit disposed in said package, such integrated circuit comprising: a differential amplifier having a nominal offset voltage, said nominal offset voltage being a function of a resistance coupled between the differential amplifier and a reference potential bus; an offset voltage programming resistor nominally decoupled from between said differential amplifier and reference potential bus; and, means, coupled to the electrical interconnection lead means and responsive to said control signal, for coupling said offset voltage programming resistor between the differential amplifier and the reference potential bus to adjust the offset voltage of the differential amplifier from the nominal offset voltage.

29. The combination of claim 28 further comprising means for coupling the control signal to the offset voltage adjusting means during the first mode of operation and decoupling the input signal from the offset voltage adjusting means during the second mode of operation.

* * * * *